United States Patent [19]
Tanizaki

[11] Patent Number: 5,297,102
[45] Date of Patent: Mar. 22, 1994

[54] SEMICONDUCTOR MEMORY DEVICE STORING DATA AND PARITY BIT

[75] Inventor: Tetsushi Tanizaki, Hyogo, Japan

[73] Assignee: Mitsubishi Denki Kabushiki Kaisha, Tokyo, Japan

[21] Appl. No.: 950,365

[22] Filed: Sep. 24, 1992

[30] Foreign Application Priority Data

Nov. 27, 1991 [JP] Japan ................................. 3-312631
Sep. 17, 1992 [JP] Japan ................................. 4-248151

[51] Int. Cl.$^5$ ............................................. G11C 8/00
[52] U.S. Cl. ................................. 365/230.03; 365/200
[58] Field of Search ................ 365/200, 230.03, 207, 365/208, 222, 51

[56] References Cited
U.S. PATENT DOCUMENTS 4,947,373  8/1990  Yamaguchi ................. 365/230.03
4,961,164  10/1990  Miyaoka ..................... 365/230.03
5,040,152  8/1991  Voss ............................. 365/200

Primary Examiner—Eugene R. LaRoche
Assistant Examiner—A. Zarabian
Attorney, Agent, or Firm—Lowe, Price, Leblanc & Becker

[57] ABSTRACT

A DRAM includes a plurality of first memory arrays and a second memory array. The plurality of first memory arrays are arranged in two lines. The second memory array is provided on one end side of a region including memory arrays. Each of first memory arrays is divided into four blocks, and performs ¼ divisional operation. The second memory array is divided into four blocks and performs ½ divisional operation. Refresh operation of the DRAM can be switched to 1024 refresh cycle and 512 refresh cycle. Each of the first memory arrays includes 1024 word lines, and the second memory array includes 512 word lines corresponding to the 512 refresh cycle.

15 Claims, 11 Drawing Sheets

FIG. 6

| REFRESH CYCLE | MEMORY ARRAY REGION A | MEMORY ARRAY REGION B |
|---|---|---|
| 1024 REFRESH CYCLE | 1/2 DIVISIONAL OPERATION | 1/4 DIVISIONAL OPERATION |
| 512 REFRESH CYCLE | 1/2 DIVISIONAL OPERATION | 1/2 DIVISIONAL OPERATION |

SEMICONDUCTOR MEMORY DEVICE STORING DATA AND PARITY BIT

BACKGROUND OF THE INVENTION

1. Field of the Invention

The present invention relates to semiconductor memory devices, and particularly to an array arrangement of a semiconductor memory device storing data and a parity bit.

Description of the Background Art

FIG. 10 is a block diagram illustrating a layout of a main portion of a conventional DRAM (Dynamic Random Access Memory) for storing data and parity bits. The DRAM can store plural sets of 8-bit data and 1-bit parity bit.

Memory arrays AR2-AR9 are arranged in two lines in a center portion of a semiconductor chip 10. Memory array AR1 is arranged in an elongate manner along a direction of a long side of semiconductor chip 10. Each of memory arrays AR2-AR9 includes a plurality of memory cells arranged in a plurality of rows and a plurality of columns. Similarly, memory array AR1 includes a plurality of memory cells arranged in a plurality of rows and a plurality of columns.

The number of rows of memory cells included in memory array AR1 is four times the number of rows of memory cells included in each of memory cell arrays AR2-AR9, and the number of columns of memory cells included in memory array AR1 is a quarter of the number of columns of memory cells included in each of memory arrays AR2-AR9.

Each of memory arrays AR2-AR9 is divided into four blocks B1-B4 including the same number of rows. One of the four blocks B1-B4 operates and the remaining three blocks are in an inactive state. This is called ¼ divisional operation.

Memory array AR1 is divided into 16 blocks B1-B16 including the same number of rows. Four of sixteen blocks B1-B16 operate and remaining blocks are in an inactive state. Thus, memory array AR1 also performs ¼ divisional operation.

When each block B1 operates in each of memory arrays AR2-AR9, blocks B1, B5, B9, B13 operate in memory array AR1.

A row decoder RD1 is provided for blocks B1-B4 of memory array AR1 and memory arrays AR2, AR9, and a row decoder RD2 is provided for blocks B5-B8 of memory array AR1 and memory arrays AR3 and AR8. A row decoder RD3 is provided for blocks B9-B12 of memory array AR1 and memory arrays AR4 and AR7, and a row decoder RD4 is provided for blocks B13-B16 of memory array AR1 and memory arrays AR5 and AR6. Each of row decoders RD1-RD4 selects one row in a corresponding memory array.

A column decoder CD1 is provided for memory arrays AR2-AR5, and a column decoder CD2 is provided for memory arrays AR6-AR9. Also, a column decoder CD3 is provided for memory array AR1. Each of column decoders CD1-CD3 selects two columns inside a corresponding memory array.

FIG. 11 is a diagram showing in detail a region indicated by a broken line R1 in FIG. 10.

As shown in FIG. 11, a local I/O line group L2a is provided between blocks B1 and B2 in memory array AR2, and a local I/O line group L2b is provided between blocks B3 and B4 in memory array AR2. Similarly, a local I/O line group L4a is provided between blocks B1 and B2 in memory array AR4. Furthermore, a local I/O line group L5a is provided between blocks B1 and B2 in memory array AR5, and a local I/O line group L5b is provided between blocks B3 and B4 in memory array AR5. Each local I/O line group includes two sets of input/output line pairs.

A local I/O line group L1a is provided between blocks B1 and B2 in memory array AR1, and a local I/O line group L1b is provided between the blocks B3 and B4. Similarly, a local I/O line group L1e is provided between blocks B9 and B10. Furthermore, a local I/O line group L1g is provided between blocks B13 and B14, and a local I/O line group L1h is provided between blocks B15 and B16.

Local I/O line groups L2a and L2b are connected to a global I/O line pair GI02 through switches S2a and S2b, respectively. Local I/O line groups L5a and L5b are connected to a global I/O line pair GI05 through switches S5a and S5b, respectively. Also, local I/O line groups L1a, L1b, ..., L1g, L1h are connected to global I/O line pairs GI01 through switches S1a, S1b, ..., S1g, S1h, respectively. In reading operation, one of switches S2a and S2b, one of switches S5a and S5b, and one of switches S1a-S1h turn on. For example, switches S2a and S5a, and switch S1a turn on.

Thus, data read from block B1 or block B2 of memory array AR2 onto local I/O line group L2a is transmitted to global I/O line pair GI02 through switch S2a and data read from block B1 or block B2 of memory array AR5 onto local I/O line group L5a is transmitted to global I/O line pair GI05 through switch S5a. Also, data read from block B1 or block B2 of memory array AR1 onto local I/O line group L1a is transmitted to global I/O line pair GI01 through switch S1a.

In the above-described conventional DRAM, as shown in FIG. 11, memory array AR1 is provided in an elongated manner in a direction of a long side of a semiconductor chip, so that global I/O line pair GI01 is extremely long as compared to global I/O line pairs corresponding to other memory arrays. Accordingly, it has a problem that an access speed is low due to the long global I/O line pair.

Two sets of local I/O line groups L1a and L2a are provided between blocks B1 and B2 of memory array AR1, and two sets of local I/O line groups L1b and L2b are provided between the blocks B3 and B4. Similarly, two sets of local I/O line groups L1g and L5a are provided between blocks B13 and B14 in memory array AR1, and two sets of local I/O line groups L1h and L5b are provided between the blocks B15 and B16.

Thus, a structure of local I/O line groups corresponding to memory array AR1 is complicated, and local I/O line groups corresponding to each memory array produce effects upon arrangement of adjacent memory array blocks. As a result, there is a problem that the layout of memory arrays is difficult.

SUMMARY OF THE INVENTION

It is an object of the present invention to facilitate layout of blocks of a memory array and also increase an access speed in a semiconductor memory device capable of storing data and a parity bit.

It is another object of the present invention to reduce consumption power in refresh operation in a semiconductor device capable of storing data and a parity bit.

A semiconductor memory device formed on a chip according to the present invention includes a plurality of first memory arrays arranged at least in two columns each including a plurality of first memory arrays. Each of the plurality of first memory arrays includes a plurality of first memory cells arranged in a plurality of rows and a plurality of columns, and also is divided into a first number of blocks arranged in a column direction for divisional operation.

The semiconductor device further includes a second memory array. The second memory array includes a plurality of columns of second memory cells aligned with the columns of the first memory cells of first memory arrays, and also is divided into a second number of blocks arranged in a column direction for divisional operation.

The second number is no greater than half of the first number. First memory cells included in each of the first number of blocks and second memory cells included in each of the second number of blocks are arranged in the same number of rows.

The semiconductor memory device further includes an memory arrays in parallel.

The at least two columns may be 2m lines with in respectively a positive integer, the first number may be 4mn with n respectively a positive integer, and the second number may be 2n.

In the semiconductor memory device, the columns of memory cells included in the second memory array are aligned with the columns of memory cells included in the first memory arrays arranged in at least two columns, and the second memory array is divided into a number of blocks no greater than half of the number of blocks of the first memory array.

It facilitates arrangement of blocks of memory arrays, simplifies structure of input/output lines, and shortens length of an input/output line. Accordingly, it facilitates layout and also increases access speed.

A semiconductor memory device according to another aspect of the present invention further includes a refresh control circuit capable of selectively performing first refresh operation having a third number of cycles and second refresh operation having a fourth number of cycles.

The plurality of memory cells included in each of the plurality of first memory arrays are arranged in the third number of rows and the plurality of memory cells included in the second memory array are arranged in the fourth number of rows.

In the semiconductor memory device, the number of rows of the second memory array is the same as the number of cycles of the second refresh operation. Accordingly, when the second refresh operation having a smaller number of cycles is performed by the refresh control circuit, power is not wastefully consumed in the second memory array. Accordingly, consumption power is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram for use in describing the 1024 refresh cycle and the 512 refresh cycle.

DESCRIPTION OF THE PREFERRED EMBODIMENTS

Figure 1:
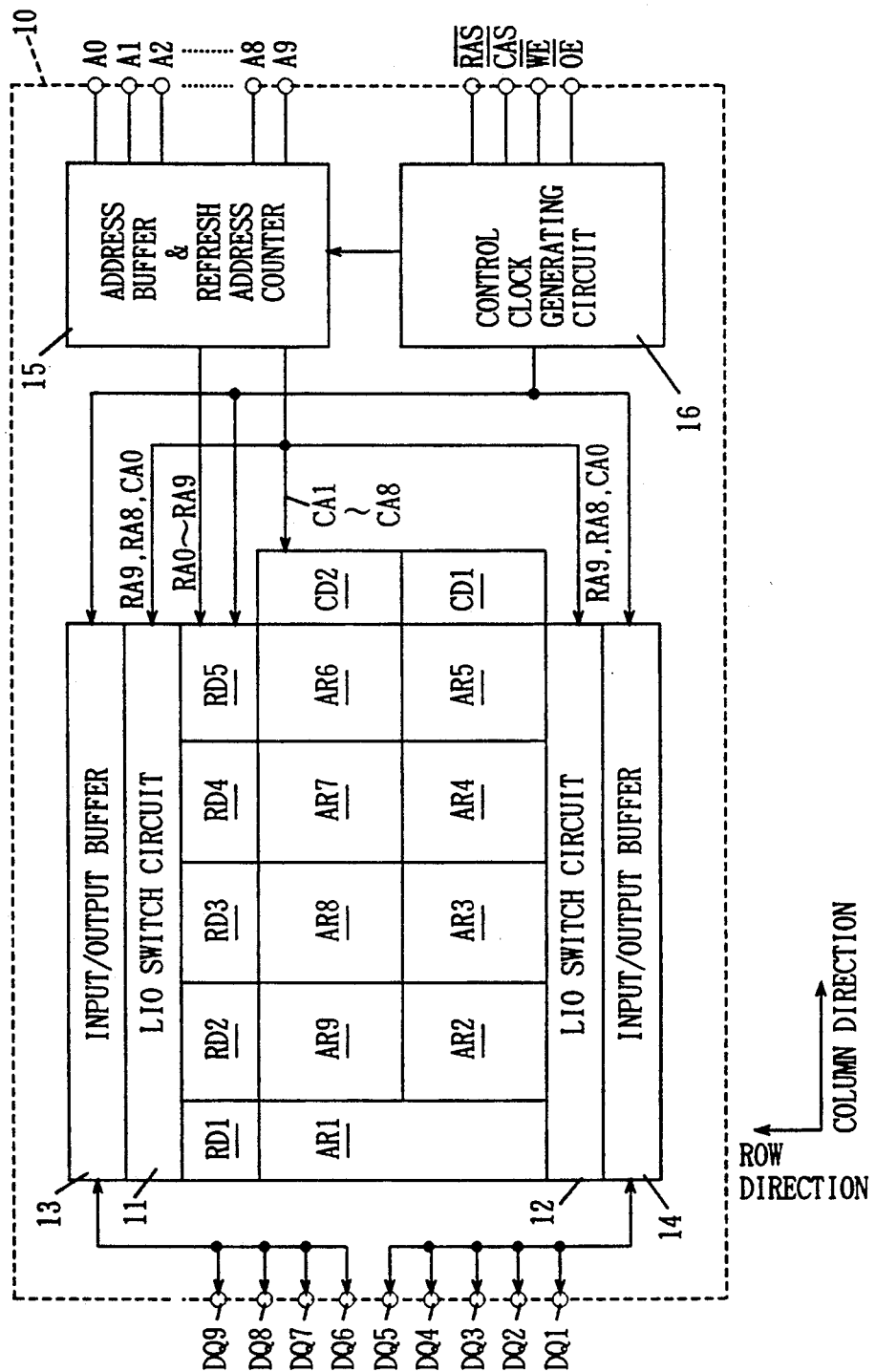
FIG. 1 is a block diagram illustrating a structure of the entirety of a DRAM according to the first embodiment of the present invention.

Referring to FIG. 1 illustrating a structure of the entirety of a DRAM by the first embodiment of the present invention, memory arrays AR2-AR9 are arranged in two lines in a center portion of a semiconductor chip 10. Also, a memory array AR1 is provided in parallel with a short side of semiconductor chip 10.

Row decoders RD1-RD5 are provided on one side of a region in which memory arrays AR1-AR9 are formed, and, an LIO switch circuit 11 and an input/output buffer 13 are further provided on a side thereof. An LIO switch circuit 12 and an input/output buffer 14 are provided on the other side of the region in which memory arrays AR1-AR9 are formed. Column decoders CD1 and CD2 are provided on one end of the region in which memory arrays AR1-AR9 are formed.

An address buffer and refresh address counter 15 receives externally applied address signals A0-A9, applies row address signals RA0-RA9 to row decoders RD1-RD5 and applies column address signals CA1-- CA8 to column decoders CD1 and CD2. Also, address buffer & refresh counter 15 applies column address signal CA0 to LIO switch circuits 11 and 12.

A control clock generating circuit 16 receives a row address strobe signal $\overline{RAS}$, a column address strobe signal $\overline{CAS}$, a write enable signal $\overline{WE}$ and an output enable signal $\overline{OE}$, which are externally applied, and generates a control clock signal for controlling respective circuits of the DRAM.

Data input/output terminals DQ1-DQ9 for inputting and outputting 8-bit data and 1-bit parity bit are provided on semiconductor chip 10. Data input/output terminals DQ6-DQ9 are connected to input/output buffer 13. Data input/output terminals DQ1-DQ5 are connected to input/output buffer 14.

Figure 2:
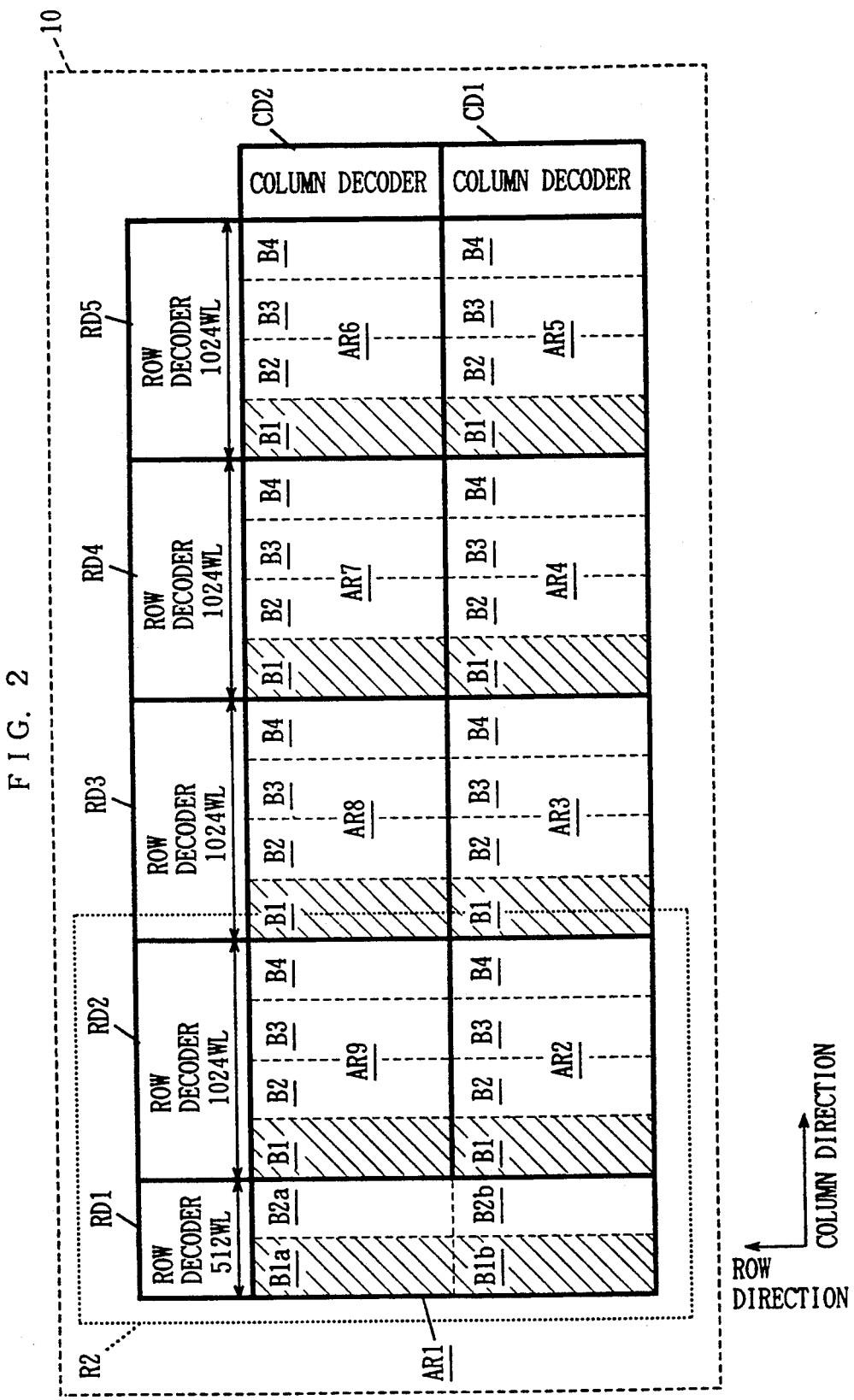
FIG. 2 is a block diagram illustrating layout of a main portion of the DRAM of FIG. 1.

FIG. 2 is a block diagram illustrating a structure of a main portion of the DRAM of FIG. 1. Each of memory arrays AR2-AR9 includes a plurality of memory cells arranged in a plurality of rows and a plurality of columns. Memory array AR1 includes a plurality of memory cells arranged in a plurality of rows and a plurality of columns. The number of columns of memory cells included in memory array AR1 is double the number of columns of memory cells included in each of memory arrays AR2-AR9, and the number of rows of memory cells included in memory array AR1 is a half of the number of rows of memory cells included in each of memory arrays AR2-AR9.

For example, memory array AR1 includes 512 word lines and each of memory arrays AR2-AR9 includes 1024 word lines.

Each of memory arrays AR2-AR9 is divided into four blocks B1-B4 including the same number of rows. One of four blocks B1-B4 operates and remaining blocks are brought into an inactive state. Thus, each of memory arrays AR2-AR9 performs 1/4 divisional operation.

On the other hand, memory array AR1 is divided into four blocks B1a, B2a, B1b, B2b each including the same number of rows. Blocks B1a and B1b simultaneously operate and blocks B2a and B2b simultaneously operate. When blocks B1a and B1b are operating, blocks B2a and B2b are in an inactive state. On the other hand, when blocks B2b are operating, blocks B1a and B1b are in an inactive state. Thus, memory array AR1 performs ½ divisional operation.

For example, when block B1 is operating in each of memory arrays AR2-AR9, blocks B1a and B1b operate in memory array AR1. When block B2 is operating in each of memory arrays AR2-AR9, blocks B2a and B2b operate in memory array AR1. On the other hand, when block B3 is operating in each of memory array AR2-AR9, blocks B1a and B1b operate in memory array AR1. When block B4 is operating in each of memory arrays AR2-AR9, blocks B2a and B2b operate in memory array AR1.

For example, memory array AR1 includes 512 word lines. Memory arrays AR2 and AR9 include 1024 word lines. Similarly, memory arrays AR3 and AR8 also include 1024 word lines, memory arrays AR4 and AR7 also include 1024 word lines, and memory arrays AR5 and AR6 also includes 1024 word lines.

In normal operation, row decoder RD1 selects one of 512 word lines in memory array AR1. Row decoder RD2 selects any of 1024 word lines in memory arrays AR2 and AR9. Similarly, row decoder RD3 selects any of 1024 word lines in memory arrays AR3 and AR8, and row decoder RD4 selects any of 1024 word lines in memory arrays AR4 and AR7. Row decoder RD5 selects any of 1024 word lines in memory arrays AR5 and AR6. Column decoder CD1 selects any of the plurality of columns of blocks B1b and B2b in memory array AR1 and any of the plurality of columns in memory arrays AR2-AR5. Column decoder CD2 selects any of the plurality of columns of blocks B1a and B2a inside memory array AR1 and any of the plurality of columns inside memory arrays AR6-AR9.

Figure 3:
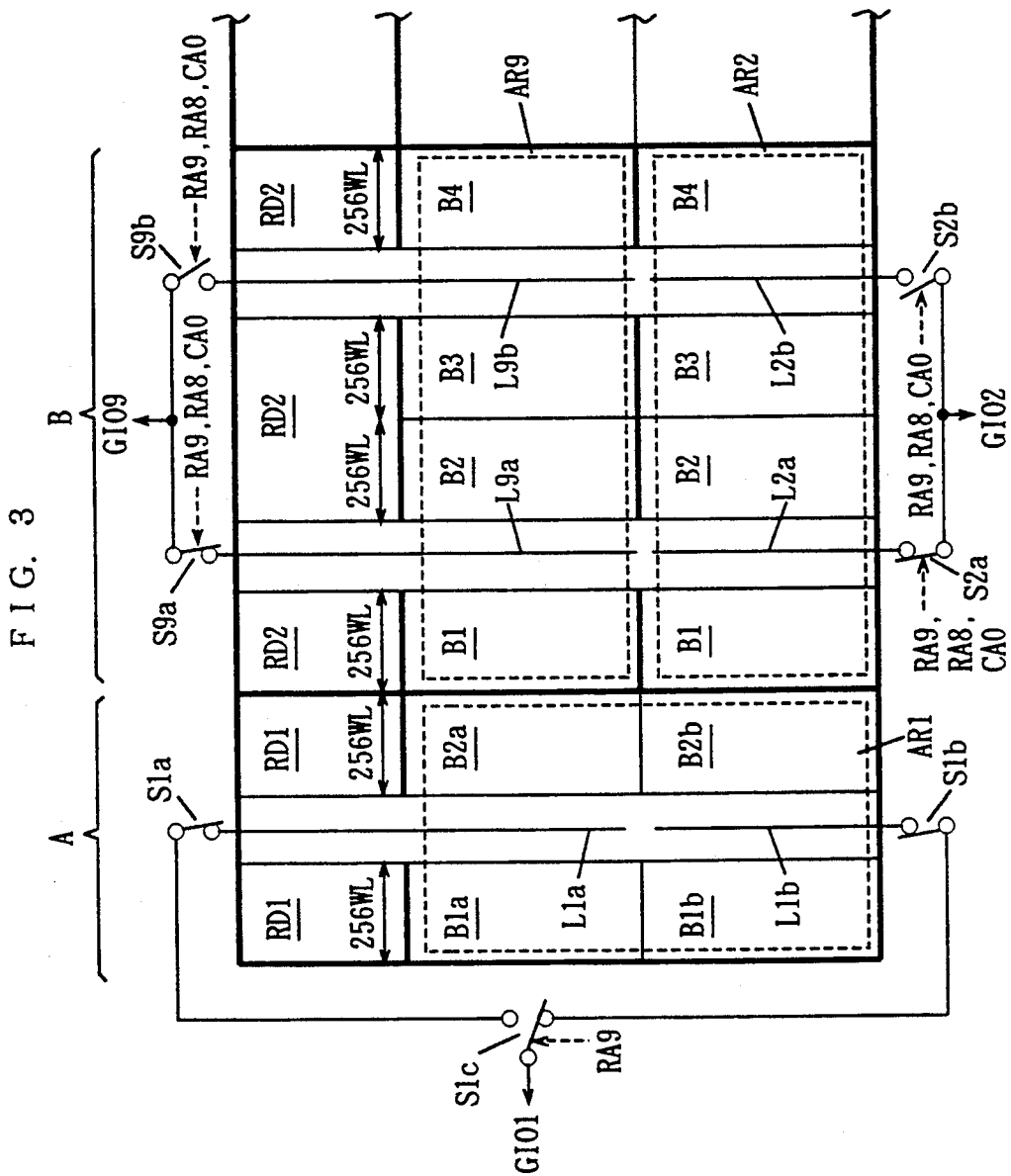
FIG. 3 is a diagram illustrating in detail a structure of a part of memory array shown in FIG. 2.

FIG. 3 is a diagram illustrating in detail the portion designated by a broken line R2 in FIG. 2. A local I/O line group L1a is provided between blocks B1a and B2a in memory array AR1, and a local I/O line group L1b is provided between the blocks B1b and B2b. A local I/O line group L2a is provided between blocks B1 and B2 in memory array AR2, and a local I/O line group L2b is provided between blocks B3 and B4. A local I/O line group L9a is provided between the blocks B1 and B2 in memory array AR9 and a local I/O line group L9b is provided between the blocks B3 and B4. Each local I/O line groups includes two sets of input/output line pairs.

Each block in memory array AR1 includes 256 word lines, and each block inside memory arrays AR2 and AR9 also includes 256 word lines.

Local I/O line groups L1a and L1b are connected to a switch S1c through switches S1a and S1b, respectively. Switch S1c is connected to a global I/O line pair GI01. global I/O line pair GI02 through switches S2a and S2b, respectively. Local I/O line groups L9a and L9b are connected to a global I/O line pair GI09 through switches S9a and S9b, respectively.

In normal operation, in response to a row address signal RA9, switch S1c is changed to the switch S1a side or to the switch S1b side. Also, in response to row address signals RA8 and RA9, one of switches S2a and S2b turns on and one of switches S9a and S9b turns on.

For example, switch S1c is changed to the switch S1b side, and then switch S2a and switch S9a turn on. Thus, data read to local I/O line group L1b from block B1b or block B2b in memory array AR1 is transmitted to global I/O line pair GI01 through switch S1b and switch S1c.

Simultaneously, data read to local I/O line group L2a from block B1 or block B2 in memory array AR2 is transmitted to global I/O line pair GI02 through switch S2a and data read out to local I/O line group L9a from block B1 or B2 in memory array AR9 is transmitted to global I/O line pair GI09 through switch S9a.

Figure 4:
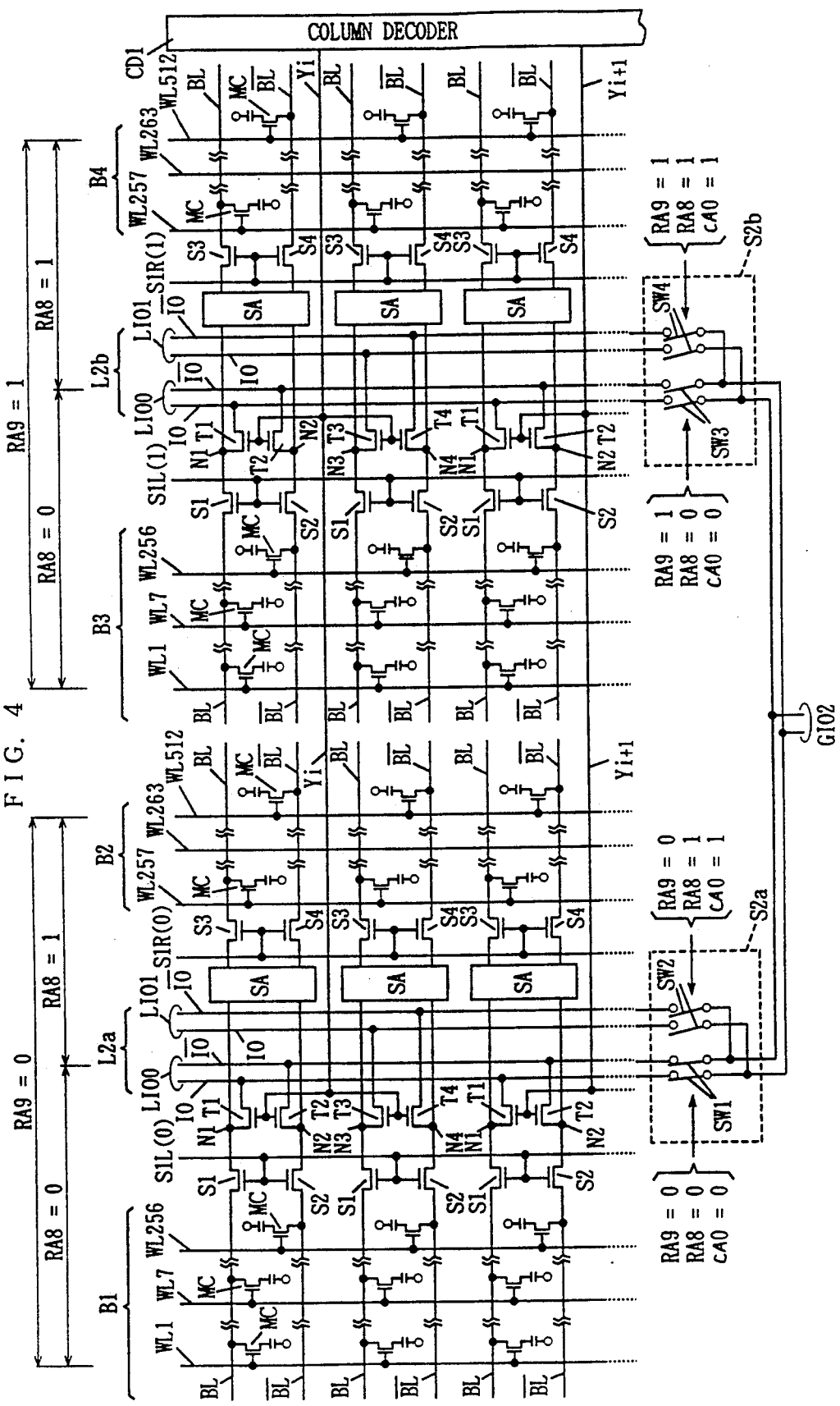
FIG. 4 is a circuit diagram illustrating a structure of one memory array.

FIG. 4 is a circuit diagram illustrating a further detail structure of memory array AR2.

Block B1 includes plural sets of bit line pairs BL, $\overline{BL}$, 256 word lines WL1-WL256 intersecting the bit line pairs, and a plurality of memory cells MC provided on intersections thereof. Similarly, block B2 includes plural sets of bit line pairs BL, $\overline{BL}$, 256 word lines WL257-WL512 intersecting the bit line pairs, and a plurality of memory cells MC provided on intersections thereof.

A plurality of sense amplifiers SA and local I/O line group L2a are provided between blocks B1 and B2. Local I/O line group L2a includes two sets of input/output line pairs LI00 and LI01. Each of the two sets of local I/O line pairs LI00 and LI01 includes input/output lines IO, $\overline{IO}$.

Each bit line pair BL, $\overline{BL}$ inside block B1 is connected to a corresponding sense amplifier SA through N-channel MOS transistors S1 and S2. Each bit line pair BL, $\overline{BL}$ inside block B2 is connected to a corresponding sense amplifiers SA through N-channel MOS transistors S3 and S4. A switch signal SIL (0) is applied to gates of transistors S1 and S2, and a switch signal SIR (0) is applied to gates of transistors S3 and S4.

Nodes N1 and N2 of sense amplifiers SA corresponding to odd bit line pairs BL, $\overline{BL}$ are connected to input/output line pair LI00 through N-channel MOS transistors T1 and T2. Nodes N3 and N4 of sense amplifiers SA corresponding to even bit line pairs BL, $\overline{BL}$ are connected to input/output line pair LI01 through N-channel MOS transistors T3 and T4. A column selection line Yi from column decoder CD1 connected to gates of transistors T1- T4 corresponding to adjacent two sets of bit line pairs BL, $\overline{BL}$.

The blocks B3 and B4 have structures similar to blocks B1 and B2, respectively. A plurality of sense amplifiers SA and local I/O line group L2b are provided between blocks B3 and B4. Local I/O line group L2b includes two sets of local I/O line pairs LI00 and LI01 similarly to local I/O line group L2a. A switch signal SIL(1) is applied to gates of transistors S1 and S2 corresponding to block B3 and a switch signal SIR(1) is applied to gates of transistors S3 and S4 corresponding to block B4.

Switch signals SIL(0), SIR(0), SIL(1), SIR(1) are produced using row address signals RA8 and RA9 for selecting blocks B1-B4. For example, when a row address signal RA8 is at "0" and a row address signal RA9 is at "0", a switch signal SIL(0) attains "H" and block B1 is selected.

The local I/O line group L2a is connected to the global I/O line pair GI02 through the switch S2a and the local I/O line group L2b is connected to the global I/O line pair GI02 through the switch S2b. The switch S2b includes first and second switches SW1 and SW2. The switch SW1 is connected between the local I/O line pair LIO0 in the local I/O line group L2a and the global I/O line pair GI02 and the switch SW2 is connected between the local I/O line pair LIO1 in the local I/O line group L2a and the global I/O line pair GI02. The switch S2b includes third and forth switches SW3 and SW4. The switch SW3 is connected between the local I/O line pair LIO0 in the local I/O line group L2b and the global I/O line pair GI02, and the switch SW4 is connected between the local I/O line pair LIO1 in the local I/O line group L2b and the global I/O line pair GI02.

Switches SW1, SW2, SW3 and SW4 are controlled in response to row address signals RA8 and RA9 and a column address signal CA0. For example, when a row address signal RA8 is at "0" and a low address signal RA9 is at "0", and a column address signal CA0 is also at "0", the switch SW1 turns on.

Figure 5:
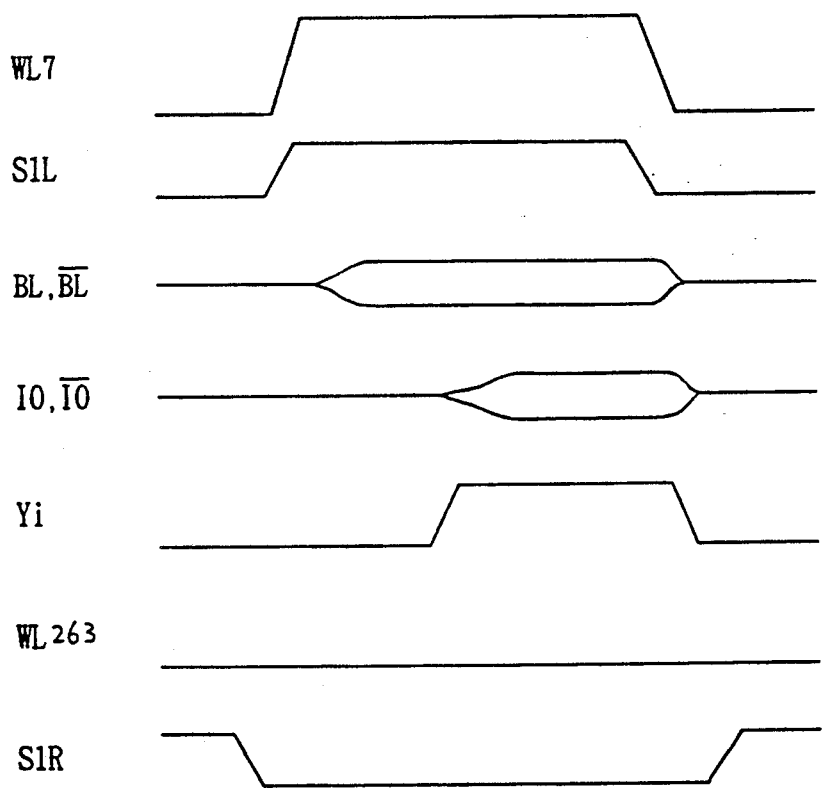
FIG. 5 is a waveform diagram for use in describing operation of the DRAM shown in FIG. 4.

Next, referring to the waveform diagram of FIG. 5, operation of blocks B1 and B2 shown in FIG. 4 will be described.

First, for example, a switch signal SIR (0) falls to "L" and a switch signal SIL(0) rises to "H". It turns on transistors S1 and S2 and turns off transistors S3 and S4.

Subsequently, potential of word line WL7 is raised to "H" by row decoder RD2 (refer to FIGS. 1 through 3). It causes data to be read out from a row of memory cells MC connected to word line WL7 onto corresponding bit lines, respectively. As a result, potential difference occurs between each bit line pair BL, $\overline{BL}$.

The potential difference on each bit line pair BL, $\overline{BL}$ is amplified by a corresponding sense amplifier SA. On the other hand, potential of word line WL263 inside block B2 remains at "L".

Next, by column decoder CD1, potential of a column selection line Yi is raised to "H", for example. It turns on corresponding transistors T1-T4. As a result, potential difference on corresponding two sets of bit line pairs BL, $\overline{BL}$ are transmitted to input/output line pairs LIO0, LIO1, respectively.

Thus, data of two selected memory cells MC are read onto two sets of input/output line pairs LIO0 and LIO1 in local I/O line group L2a, respectively. Two data on local I/O line group L2a are applied to switch S2a shown in FIG. 3, and one of two data is selected and transmitted to global I/O line pair GI02.

Next, referring to FIGS. 3 and 6, refresh operation will be described. In the DRAM, the 1024 refresh cycle and the 512 refresh cycle can be performed.

First, the 1024 refresh cycle will be described. The address buffer and refresh address counter 15 shown in FIG. 1 generates row address signals RA0-RA9 as refresh address signals.

Row decoder R2 sequentially selects 1024 word lines inside memory arrays AR2 and AR9 in response to refresh address signals.

When word lines inside blocks B1 and B2 of memory arrays AR2 and AR9 are sequentially selected, word lines inside memory array AR1 are sequentially selected by row decoder RD1. When word lines inside blocks B3 and B4 of memory arrays AR2 and AR9 are sequentially selected, word lines inside memory array AR1 are also sequentially selected by row decoder RD1. That is, each word line inside memory array AR1 is selected twice in a single 1024 refresh cycle.

Data are respectively read out to corresponding bit lines from a row of memory cells connected to a selected word line, and the read data are amplified by corresponding sense amplifiers. Thus, each memory cell is refreshed.

As described above, in the 1024 refresh cycle, ½ divisional operation is performed in a memory array region "A" including memory array AR1, and ¼ divisional operation is performed in a memory array region B including memory arrays AR2 and AR9.

Next, the 512 refresh cycle will be described. Row decoder RD2 sequentially selects 512 word lines inside blocks B1 and B2 of memory arrays AR2 and AR9 in response to refresh address signals applied from the address buffer and refresh address counter 15 shown in FIG. 1, and simultaneously, sequentially selects 512 word lines inside blocks B3 and B4 of memory arrays AR2 and AR9. At this time, in memory array AR1, 512 word lines are sequentially selected by row decoder RD1.

In this case, each word line inside memory array AR1 and each word line inside memory arrays AR2 and AR9 are respectively selected one time in a single 512 refresh cycle.

As described above, in the 512 refresh cycle, ½ divisional operation is performed in memory array region A and ½ divisional operation is also performed in the memory array region B.

In the embodiment described above, as shown in FIG. 3, a set of local I/O lines L1a are provided between blocks B1a and B2a inside memory array AR1, and a set of local I/O lines L1b are provided between the blocks B1b and B2b. Also, a set of local I/O lines L2a are provided between blocks B1 and B2 inside memory array AR2, and a set of local I/O lines L2b are also provided between the blocks B3 and B4. Also, a set of local I/O lines L9a are provided between blocks B1 and B2 inside memory array AR9, and a set of local I/O lines L9b are provided between the blocks B3 and B4. Each of local I/O lines includes two pairs of input/output lines.

Thus, local I/O lines for memory array AR1 do not affect arrangement of blocks inside other memory arrays. Also, the length of interconnection between local I/O lines L1a and L1b for memory array AR1 and global I/O line GIO1 is reduced. Accordingly, input/output lines of hierarchical structure can be constructed simply, and also, an access speed is increased.

Furthermore, in the 512 refresh cycle, each word line inside memory array AR1 and each word line of each memory arrays AR2-AR9 are selected one time. Accordingly, wasteful power is not consumed to reduce consumption power of DRAM.

Figure 7:
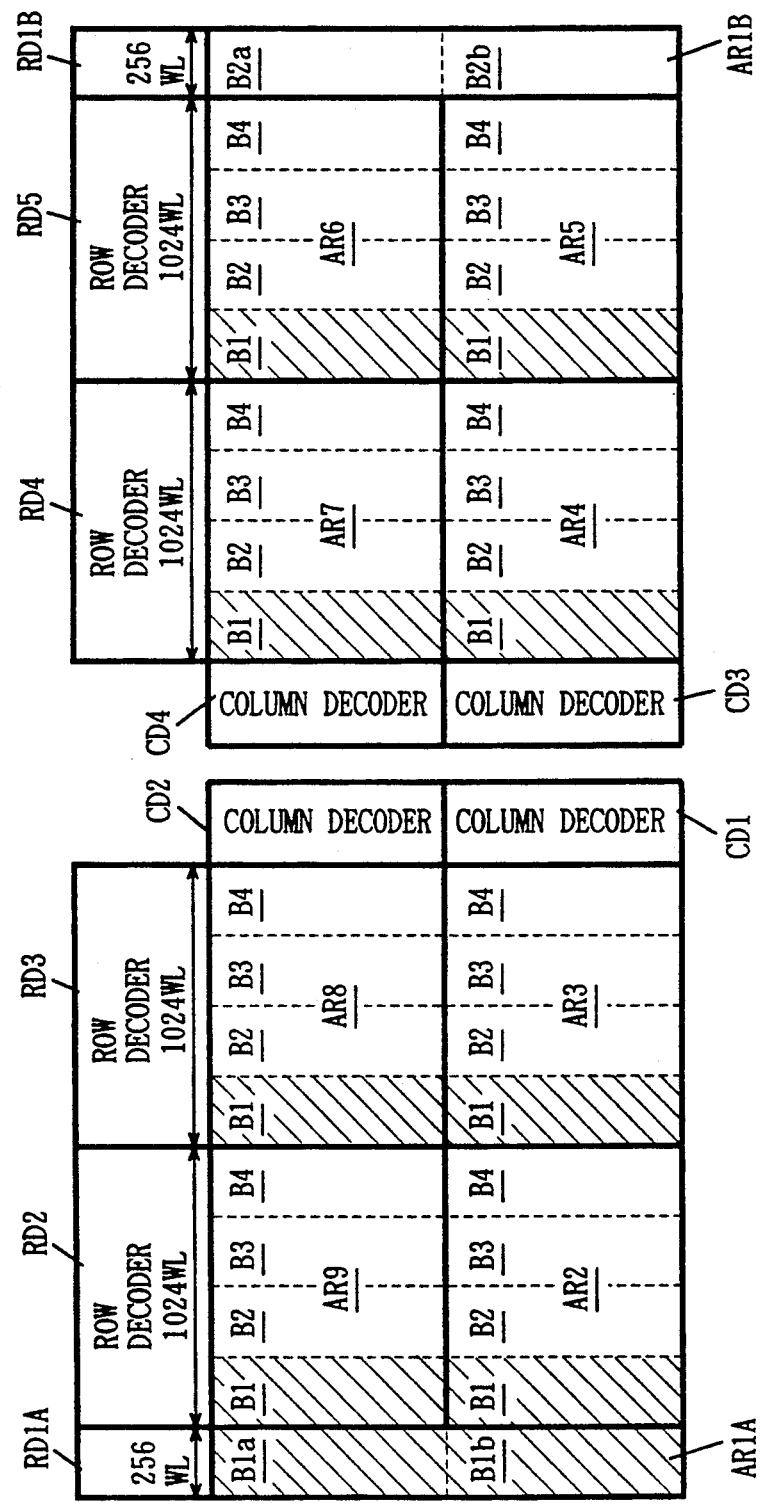
FIG. 7 is a block diagram illustrating layout of a main portion of a DRAM according to the second embodiment of the present invention.

FIG. 7 is a block diagram showing layout of a main portion of a DRAM by the second embodiment of the present invention.

In the DRAM, a memory array AR1A is provided on one end of a region including memory arrays AR2, AR3, AR8 and AR9, and column decoders CD1 and CD2 are provided at the other end. On the other hand, a memory array AR1B is provided on one end of a region including memory arrays AR4, AR5, AR6 and AR7, and column decoders CD3 and CD4 are provided on the other end thereof.

A row decoder RD1A is provided for memory array AR1A, and a row decoder RD1B is provided for memory array AR1B. Row decoders RD2-RD5 are provided similar to the first embodiment.

Memory array AR1A includes blocks B1$a$ and B1$b$. Memory array AR1B includes blocks B2$a$ and B2$b$. Each of memory arrays AR1A and AR1B includes 256 word lines. A structure of each of memory arrays AR2-AR9 is the same as the structure of each of memory arrays AR2-AR9 in the first embodiment.

In the DRAM of FIG. 7, since a length of a column selection line connected to column decoders CD1-CD4 is half a length of the column selection line in the first embodiment, operational speed of each column decoder is increased.

However, in the DRAM of FIG. 7, since memory arrays AR1A and AR1B are separated, it is necessary to provide {a sense amplifiers} and {local I/O line groups} in each of memory arrays AR1A and memory array AR1B.

Also, when making a DRAM storing 16-bit data and 2-bit parity bits with such a memory array arrangement as shown in FIG. 7, each of memory arrays AR1A and AR1B corresponds to 1 bit. Accordingly, in the 512 refresh cycle, each word line inside memory array AR1A and each word line inside memory array AR1B are respectively selected twice, resulting in waste of power.

On the other hand, in the DRAM of the first embodiment, in the 512 refresh cycle, each word line inside memory array AR1 and each word line inside memory arrays AR2-AR9 are selected only a single time, so that wasteful power is not consumed.

As in the first embodiment, by setting the number of word lines included in memory array AR1 corresponding to refresh operation having a smaller number of cycles, most appropriate array arrangement with reduced power consumption can be obtained.

Figure 8:
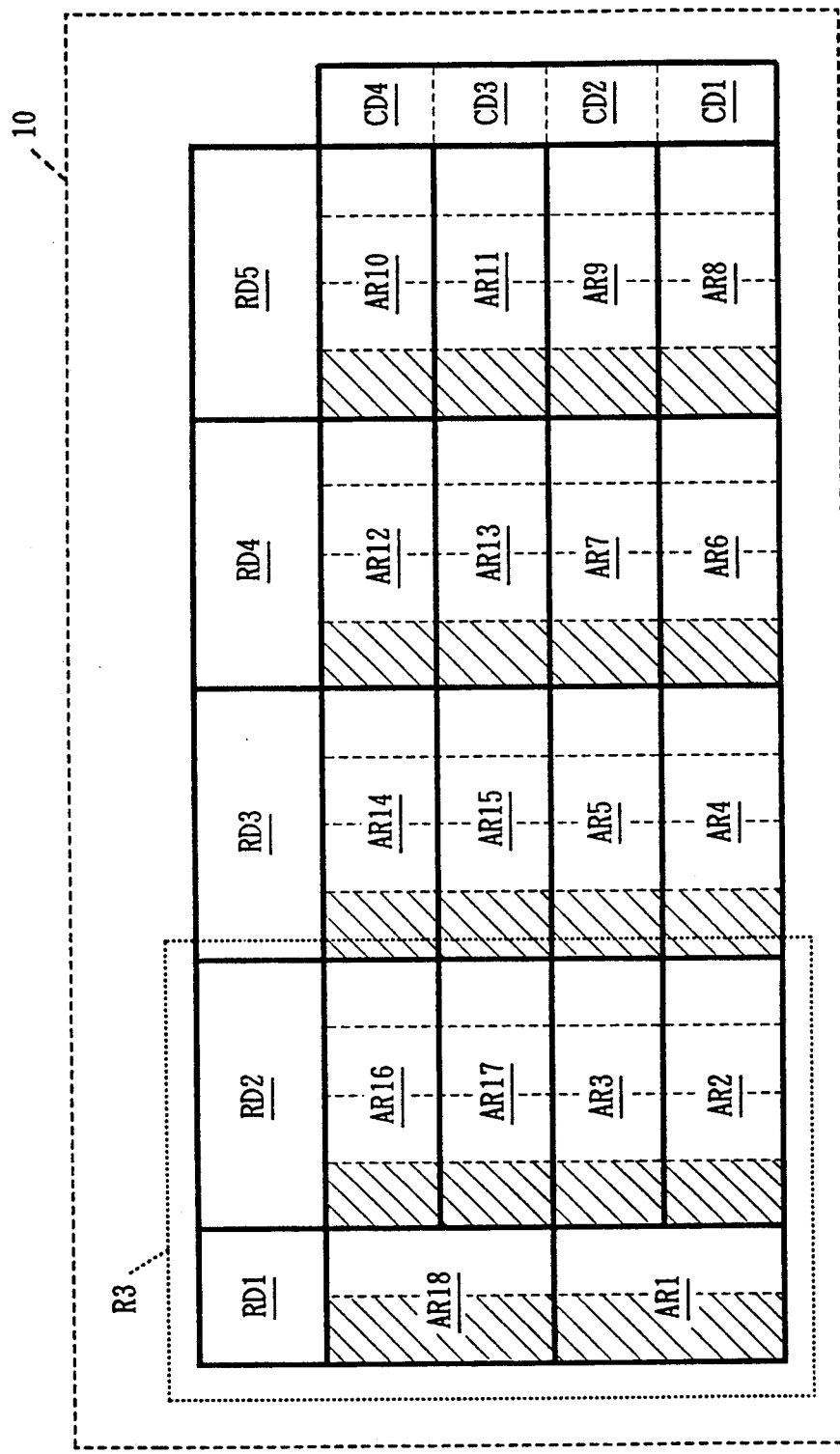
FIG. 8 is a block diagram illustrating layout of a main portion of a DRAM according to the third embodiment of the present invention.

FIG. 8 is a block diagram illustrating layout of a main portion of DRAM by the third embodiment of the present invention. This DRAM can store 16-bit data and 2-bit parity bits.

Sixteen memory arrays AR2-AR17 are arranged in four lines in a center portion of a semiconductor chip 10. Memory arrays AR1 and AR18 are provided on one end of a region including memory arrays AR2-AR17, and column decoders CD1-CD4 are provided on the other end. Also, row decoders RD1-RD5 are provided on one side of a region including memory arrays AR2-AR17.

The number of columns of memory cells included in each of memory arrays AR1 and AR18 is double the number of columns of memory cells included in each of memory arrays AR2-AR17, and the number of rows of memory cells included in each of memory arrays AR1 and AR18 is ½ of the number of rows of memory cells included in each of memory arrays AR2-AR17.

Row decoder RD1 selects any of a plurality of rows inside memory arrays AR1 and AR18. Row decoder RD2 selects any of a plurality of rows inside memory arrays AR2, AR3, AR16 and AR17, and row decoder RD3 selects any of a plurality of rows of memory arrays AR4, AR5, AR14 and AR15. Row decoder RD4 selects any of a plurality of rows of memory arrays AR6, AR7, AR12 and AR13, and row decoder RD5 selects any of a plurality of rows of memory arrays AR8, AR9, AR10 and AR11.

Column decoder CD1 selects one of a plurality of columns in a corresponding portion of memory array AR1 and any of a plurality of columns of memory arrays AR2, AR4, AR6 and AR8, and column decoder CD2 selects any of a plurality of columns in a corresponding portion of memory array AR1 and any of a plurality of columns inside memory arrays AR3, AR5, AR7 and AR9.

Column decoder CD3 selects any of a plurality of columns in a corresponding portion of memory array AR18 and any of a plurality of columns inside memory arrays AR11, AR13, AR15 and AR17, and column decoder CD4 selects any of a plurality of columns in a corresponding portion of memory array AR18 and any of a plurality of columns inside memory arrays AR10, AR12, AR14 and AR16.

Each of memory arrays AR1 and AR18 performs ½ divisional operation, and each of memory arrays AR2-AR17 performs ¼ divisional operation.

Figure 9:
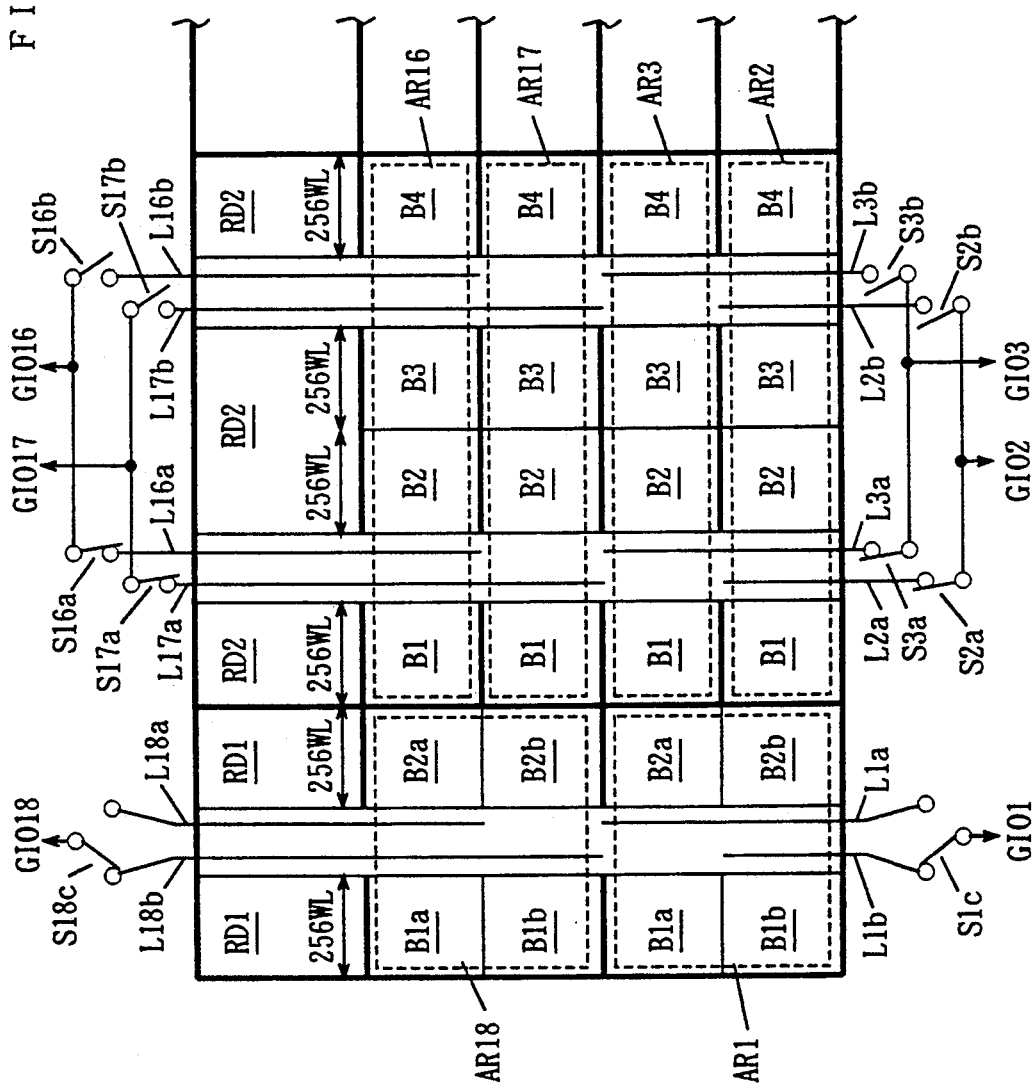
FIG. 9 is a diagram illustrating in detail a structure of a part of memory array shown in FIG. 8.
Figure 10:
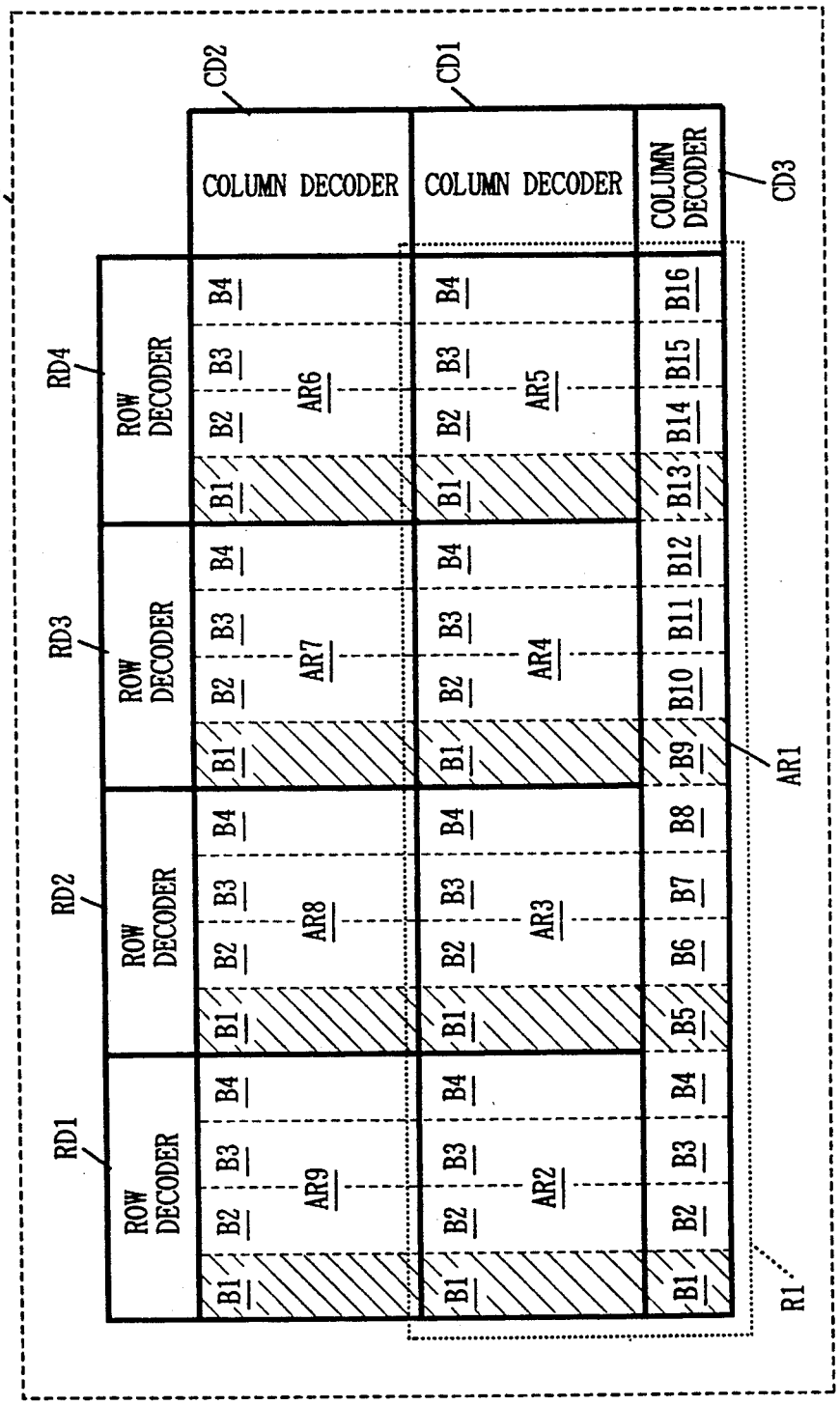
FIG. 10 is a block diagram illustrating layout of a main portion of a conventional DRAM.
Figure 11:
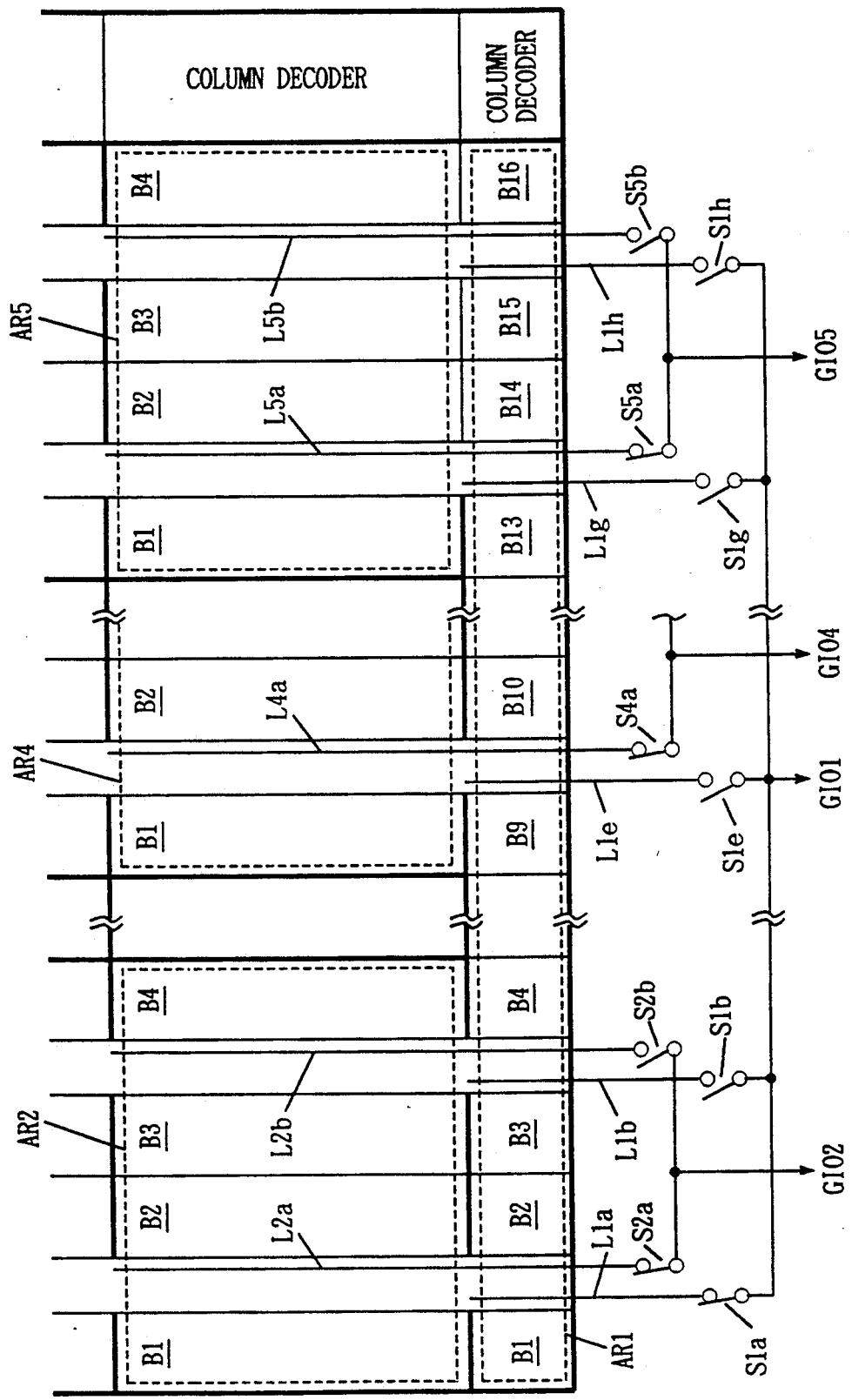
FIG. 11 is a diagram illustrating in detail a structure of a part of the memory array shown in FIG. 10.

FIG. 9 is a diagram illustrating in detail a portion indicated by the broken line R3 in FIG. 8. A local I/O line group L1$a$ is provided corresponding to blocks B1$a$ and B2$a$ in memory array AR1, and a local I/O line group L1$b$ is provided corresponding to the blocks B1$b$ and B2$b$. Similarly, a local I/O line group L18$a$ is provided corresponding to blocks B1$a$ and B2$a$ in memory array AR18 and a local I/O line group L18$b$ is provided corresponding to blocks B1$b$ and B2$b$.

Also, a local I/O line group L2$a$ is provided corresponding to blocks B1 and B2 in memory array AR2, and local I/O line group L2$b$ is provided corresponding to the blocks B3 and B4. Similarly, local I/O line groups L3$a$ and L3$b$, local I/O line groups L17$a$ and L17$b$ and local I/O line groups L16$a$ and L16$b$ are provided corresponding to memory arrays AR3, AR17 and AR16, and respectively.

Local I/O line groups L1$a$ and L1$b$ are connected to a global I/O line pair GIO1 through a switch S1$c$, and local I/O line groups L18$a$ and L18$b$ are connected to a global I/O line pair GIO18 through a switch S18$c$.

Local I/O line groups L2$a$ and L2$b$ are connected to a global I/O line pair GIO2 through switches S2$a$ and S2$b$, respectively, and local I/O line groups L3$a$ and L3$b$ are connected to a global I/O line pair GIO3 through switches S3$a$ and S3$b$, respectively.

Similarly, local I/O line groups L17$a$ and L17$b$ are connected to a global I/O line pair GIO17 through switches S17$a$ and S17$b$, respectively, and local I/O line groups L16$a$ and L16$b$ are connected to a global I/O line pair GIO16 through switches S16$a$ and S16$b$, respectively.

In normal operation, switch S1$c$ is changed to one side of local I/O line groups L1$a$ and L1$b$, and switch S18$c$ is also changed to either one of local I/O line groups L18$a$ or L18$b$. Also, one of switches S2$a$ and S2$b$, one of switches S3$a$ and S3$b$, one of switches S17$a$ and S17$b$, and one of switches S16$a$ and S16$b$ turn on, respectively.

The same effects as those of the first embodiment can also be obtained in the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a chip, comprising:

a plurality of first memory arrays arranged in at least two columns each including a plurality of first memory cells;

a second memory array; and addressing means for accessing said plurality of first memory arrays and said second memory array in parallel; wherein said plurality of first memory cells of each first memory array are arranged in a plurality of columns and a plurality of rows and said each first memory array is divided into a first number of blocks arranged in a column direction for divisional operation, said second memory array includes a plurality of second memory cells arranged in a plurality of columns aligned with the plurality of columns of said plurality of first memory cells, and is divided into a second number of blocks arranged in a column direction for divisional operation, the number of columns in each block being greater than the number of rows, said second number is no greater than half of said first number, and said plurality of first memory cells included in each of said first number of blocks and the second memory cells included in each of said second number of blocks are arranged in the same number of rows.

2. The semiconductor memory device according to claim 1, wherein said addressing means controls said divisional operation of said plurality of first memory arrays and said second memory array.

3. The semiconductor memory device according to claim 1, further comprising:

a plurality of first input/output line groups provided corresponding to said plurality of first memory arrays and each including a plurality of first input/output lines for inputting/outputting data to/from a block in a corresponding memory array;

a second input/output line group provided corresponding to said second memory array and including a plurality of second input/output lines for inputting/outputting data to/from a block in said second memory array;

a plurality of first global input/output lines provided corresponding to said plurality of first memory arrays;

a second global input/output line provided corresponding to said second memory array;

a plurality of first switch means provided corresponding to said plurality of first memory arrays each for selectively connecting any of the plurality of first input/output lines included in a corresponding first input/output line group to a corresponding first global input/output line; and second switch means provided corresponding to said second memory array for selectively connecting any of the plurality of second input/output lines included in said second input/output line group to said second global input/output line.

4. The semiconductor memory device according to claim 3, wherein each of the plurality of first input/output lines included in each first input/output line group is provided in common to adjacent two blocks, and each of the plurality of second input/output lines included in said second input/output line group is provided in common to adjacent two blocks.

5. The semiconductor memory device according to claim 4, wherein each of said first number of blocks in each first memory array comprises;

a plurality of bit lines provided corresponding to said plurality of columns of first memory cells and each connected to a corresponding column of first memory cells, a plurality of word lines provided corresponding to said plurality of rows of first memory cells and each connected to a corresponding row of first memory cells, and said plurality of bit lines forming a plurality of bit line pairs and each bit lien pair being coupled to a corresponding first input/output line, and each of said second number of blocks in said second memory array includes;

a plurality of bit lines provided corresponding to said plurality of columns of second memory cells and each connected to a corresponding column of second memory cells, a plurality of word lines provided corresponding to said plurality of rows of second memory cells and each connected to a corresponding row of second memory cells, and said plurality of bit lines forming a plurality of bit line pairs and each bit line pair being coupled to a corresponding second input/output line.

6. The semiconductor memory device according to claim 5, wherein each of said plurality of first input/output lines includes first and second input/output line pairs, said first input/output line pair being coupled to every other bit line pair in said corresponding block of said plurality of first memory arrays, each of said plurality of second input/output lines includes first and second input/output line pairs, said first input/output line pair being coupled to every other bit line pair in a corresponding block in said second memory array, and said second input/output line pair being coupled to remaining every other bit line pair in said corresponding block in said second memory array.

7. The semiconductor memory device according to claim 5, wherein:

said addressing means includes a plurality of selecting means each provided in common to the plurality of first memory arrays arranged in each column and a corresponding part of said second memory array, for selecting any of the plurality of bit line pairs in said first memory arrays provided in said each column and said corresponding part of said second memory array.

8. The semiconductor memory device according to claim 7, wherein said plurality of first memory arrays are provided on a first memory array forming region, said plurality of selecting means are provided on a selecting means forming region adjacent one of two end sides of said first memory array forming region, and said second memory array is provided on a second memory array forming region adjacent the other of two end sides of said first memory array forming region.

9. The semiconductor memory device according to claim 5, wherein the first memory arrays in each column are divided into first and second groups, said second number of blocks in said second memory array are divided into two groups corresponding to said first and second groups, and each of said plurality of selecting means includes first selecting means which belongs to said first group and second selecting means which belongs to said second group.

10. The semiconductor memory device according to claim 9, wherein said first group of first memory arrays are provided on a first memory array forming region, said second group of memory arrays are provided on a second memory array forming region, said first and second selecting means are provided on a selecting means forming region between said first and second memory array forming regions, said corresponding part of said second memory array which belongs to said first group is provided on a third memory array forming region on a side opposite to said selecting means forming region with respect to said first memory array forming region, and said corresponding part of said second memory array which belongs to said second group is provided on a fourth memory array forming region on a side opposite to said selecting means forming region with respect to said second memory array forming region.

11. The semiconductor memory device according to claim 1, further comprising:

refresh control means capable of selectively performing first refresh operation having a third number of cycles and second refresh operation having a fourth number of cycles, said fourth number being smaller than said third number;

the plurality of first memory cells included in each of said plurality of first memory arrays being arranged on a third number of rows; and the plurality of second memory cells included in said second memory array being arranged in a fourth number of rows.

12. The semiconductor memory device according to claim 1, wherein said at least two columns is 2m columns, and m expresses a positive integer, said first number is 4mn and n represents a positive integer, and said second number is 1n.

13. A semiconductor memory device formed on a semiconductor chip having first and second pairs of sides, said first pair of sides being substantially parallel and said second pair of sides being substantially parallel, comprising:

a plurality of first memory arrays arranged in 2m lines in parallel with said second pair of sides with m representing a positive integer;

a second memory array; and addressing means for accessing said second memory array and each of said first memory arrays in parallel, wherein each of said plurality of first memory arrays includes memory cells arranged in a plurality of columns and plurality of rows, and is divided into 4mn blocks arranged in parallel with said second pair of sides, with n representing a positive integer, said second memory array includes a plurality of columns of memory cells aligned with respective columns of said 2m lines of said plurality of first memory arrays and is divided into 2n blocks arranged in parallel with said second pair of sides, and said memory cells included in each of said 4mn blocks and said memory cells included in each of said 2n blocks being arranged in the same number of rows.

14. The semiconductor memory device according to claim 13, wherein said addressing means controls said divisional operation of said plurality of first memory arrays and said second memory array.

15. A semiconductor memory device formed on a substantially rectangular semiconductor chip having a first pair of parallel sides and a second pair of parallel sides, longer than said first pair of parallel sides, comprising:

a plurality of first memory arrays arranged in at least two columns with each column being parallel to said second pairs of parallel sides, each first memory array including a plurality of first memory cells arranged in a plurality of columns and a plurality of rows, and divided in a first number of blocks for divisional operation, the rows of first memory cells of each first number of blocks being parallel to said first pair of parallel sides;

a second memory array including a plurality of second memory cells arranged in a plurality of columns and a plurality of rows and divided in a second number of blocks for division operation, the plurality of columns of said second memory cells being lined with the plurality of columns of said plurality of first memory cells in said at least two columns of said plurality of first memory arrays, the rows of second memory cells of each second number of blocks being parallel to said first pair of parallel sides; and addressing means for accessing said plurality of first memory arrays and said second memory array in parallel, wherein said second number of blocks is no greater than half said first number of blocks, and the number of rows of first memory cells in each of said first number of blocks and the number of rows of second memory cells in each of said second number of blocks are the same.

* * * * *